United States Patent
Maciejewski et al.

(10) Patent No.: US 9,209,200 B2
(45) Date of Patent: Dec. 8, 2015

(54) METHODS FOR FORMING A SELF-ALIGNED MASKLESS JUNCTION BUTTING FOR INTEGRATED CIRCUITS

(71) Applicant: INTERNATIONAL BUSINESS MACHINES CORPORATION, Armonk, NY (US)

(72) Inventors: Edward P. Maciejewski, Wappingers Falls, NY (US); Chengwen Pei, Danbury, CT (US); Gan Wang, Fishkill, NY (US); Geng Wang, Stormville, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 102 days.

(21) Appl. No.: 14/057,113

(22) Filed: Oct. 18, 2013

(65) Prior Publication Data

US 2015/0108571 A1    Apr. 23, 2015

(51) Int. Cl.

| | |
|---|---|
| *H01L 21/00* | (2006.01) |
| *H01L 27/12* | (2006.01) |
| *H01L 21/84* | (2006.01) |
| *H01L 21/225* | (2006.01) |
| *H01L 29/66* | (2006.01) |
| *H01L 29/78* | (2006.01) |
| *H01L 21/16* | (2006.01) |

(52) U.S. Cl.
CPC ........ *H01L 27/1203* (2013.01); *H01L 21/2253* (2013.01); *H01L 21/84* (2013.01); *H01L 29/6653* (2013.01); *H01L 29/6659* (2013.01); *H01L 29/66636* (2013.01); *H01L 29/7834* (2013.01); *H01L 21/165* (2013.01)

(58) Field of Classification Search
CPC . H01L 27/1203; H01L 29/0653; H01L 21/84; H01L 29/66795; H01L 21/76224
USPC .................................................. 438/149, 151
See application file for complete search history.

(56) References Cited

U.S. PATENT DOCUMENTS

| | | | |
|---|---|---|---|
| 7,211,474 | B2 | 5/2007 | Cheng et al. |
| 7,274,073 | B2 | 9/2007 | Anderson et al. |
| 7,682,941 | B2 | 3/2010 | Anderson et al. |
| 8,030,716 | B2 | 10/2011 | Park et al. |
| 8,236,632 | B2 | 8/2012 | Fried et al. |
| 8,455,308 | B2 | 6/2013 | Cheng et al. |
| 8,741,759 | B2 * | 6/2014 | Huang .......................... 438/590 |
| 2012/0086077 | A1* | 4/2012 | Fried et al. ..................... 257/347 |
| 2012/0112280 | A1 | 5/2012 | Johnson et al. |
| 2012/0146147 | A1 | 6/2012 | Hook |
| 2012/0261672 | A1* | 10/2012 | Chidambarrao et al. ....... 257/77 |
| 2013/0164891 | A1 | 6/2013 | Bryant et al. |
| 2015/0097243 | A1* | 4/2015 | Ontalus et al. ................ 257/350 |

* cited by examiner

*Primary Examiner* — Andy Huynh
(74) *Attorney, Agent, or Firm* — Tutunjian & Bitetto, P.C.

(57) ABSTRACT

A method for forming a semiconductor device includes forming gate stacks on a crystalline semiconductor layer; depositing a spacer layer over a top and sidewalls of the gate stacks; recessing the semiconductor layer between the gates stacks; and depositing a non-conformal layer over the gates stacks and within the recesses such that the non-conformal layer forms a pinch point over the recesses. The non-conformal layer is etched at a bottom of the recesses through the pinch point to expose the semiconductor layer. Dopant species are implanted at the bottom of the recesses through the pinch point in the semiconductor layer. The non-conformal layer is stripped, and source and drain material is grown in the recesses. The dopant species are activated to form PN junctions to act as a junction butt between portions of the semiconductor layer.

14 Claims, 10 Drawing Sheets

US 9,209,200 B2

METHODS FOR FORMING A SELF-ALIGNED MASKLESS JUNCTION BUTTING FOR INTEGRATED CIRCUITS

BACKGROUND

1. Technical Field

The present invention relates to semiconductor processing and more particularly to methods and devices made thereby, which include self-aligned junction butting structures formed without the need for a blocking mask.

2. Description of the Related Art

Junction butting is employing to suppress cross talk in very large scale integrated (VLSI) circuits when adjacent devices employ or share a common contact therebetween. One of the disadvantages of junction butting implantation is that the implantation can significantly impact Short Channel Effects (SCE) in the adjacent transistors. To remedy this, one solution includes blocking junction butting implant species from channel regions, especially for high density devices. This is often difficult and requires added expense and time for additional masking and implantation steps.

SUMMARY

A method for forming a semiconductor device includes forming gate stacks on a crystalline semiconductor layer; depositing a spacer layer over a top and sidewalls of the gate stacks; recessing the semiconductor layer between the gates stacks; and depositing a non-conformal layer over the gates stacks and within the recesses such that the non-conformal layer forms a pinch point over the recesses. The non-conformal layer is etched at a bottom of the recesses through the pinch point to expose the semiconductor layer. Dopant species are implanted at the bottom of the recesses through the pinch point in the semiconductor layer. The non-conformal layer is stripped, and source and drain material is grown in the recesses. The dopant species are activated to form PN junctions to act as a junction butt between portions of the semiconductor layer.

In one embodiment, the dopant atoms are activated in the semiconductor layer, which has a same conductivity as source/drain regions, but an opposite conductivity from a body region underneath a transistor gate. In this way, PN junctions of source to body and drain to body are butted to a buried dielectric layer (buried oxide (BOX)) completely, so that the butted junctions shut off cross-talk (current leakage) between bodies of adjacent transistors which share common contacts. This junction butting scheme could be also extended to between portions of the semiconductor layer.

A method for forming a semiconductor device includes forming gate stacks on a crystalline semiconductor layer of a semiconductor on insulator (SOI) structure; depositing a spacer layer over a top and sidewalls of the gate stacks; recessing the semiconductor layer between the gates stacks without reaching a buried dielectric of the SOI structure; depositing a non-conformal layer over the gates stacks and within the recesses such that the non-conformal layer forms a pinch point over the recesses; etching the non-conformal layer at a bottom of the recesses through the pinch point to form self-aligned windows that expose the semiconductor layer; implanting dopant species at the bottom of the recesses through the pinch point and into the windows in the semiconductor layer to form self-aligned implant regions; stripping the non-conformal layer; growing source and drain material in the recesses; and activating the implant regions to form PN junctions to act as a junction butt between portions of the semiconductor layer.

A semiconductor device includes a plurality of gate structures formed on a semiconductor device layer of a semiconductor on insulator (SOI) structure, recesses formed in the semiconductor layer between the gate stacks, the recesses each include a self-aligned window portion at a bottom of the recess, and source and drain (S/D) regions formed in the recesses and window portions of semiconductor layer between the gate stacks such that adjacent gate stacks share a S/D region disposed therebetween. A junction butt is formed in the semiconductor layer between the window portions and a buried dielectric of the SOI structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
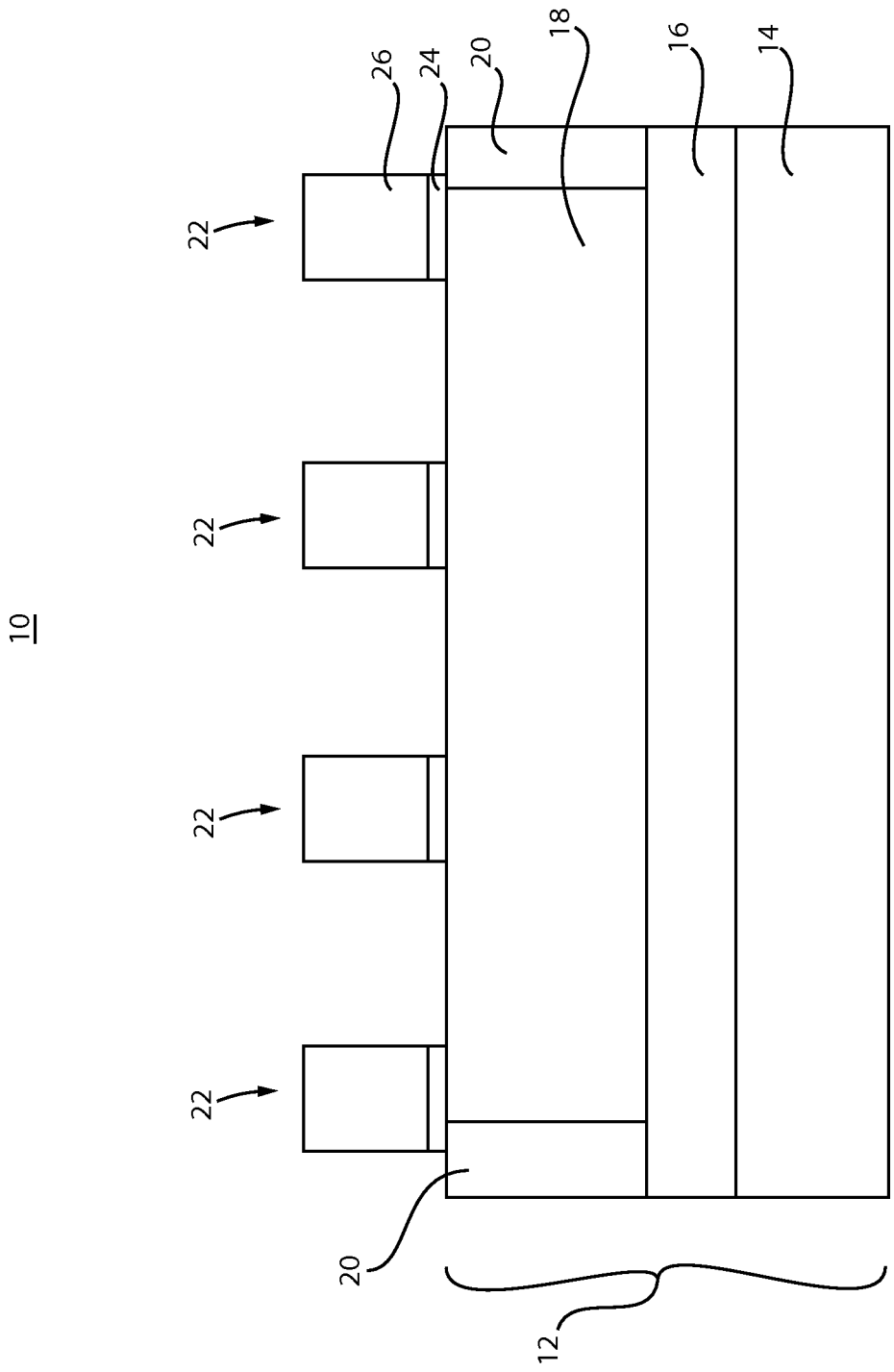
FIG. 1 is a cross-sectional view of a partially fabricated semiconductor device having gate stacks formed thereon in accordance with the present principles.

In accordance with the present principles, self-aligned mask-less implantation methods are provided that form junction butting structures between electronic devices. The methods eliminate the need for employing a lithography process to pattern a mask for junction butting implantation. The maskless methods eliminate resist residual risk in source drain trenches or other structures.

For example, with recessed trenches employed for forming source and drain (S/D) regions, junction butting includes forming a mask, lithographically, after reactive ion etching S/D trenches. Aside from the added steps, there is a high risk of resist residually being present in the trenches. This results in weaker junction butting and reduced epitaxial crystal quality when forming the S/D regions as well as other yield issues.

In accordance with useful embodiments, the junction butting implantation is completely self-aligned without need of blocking masks. In addition, in one structure, junction butting implant species are introduced at a bottom of the trenches only. The non-conformal layer in the recessed trenches prevents dopant species from scattering into a channel region or into other regions of a transistor (e.g., gate and source or gate and drain regions. Therefore, the implantation does not impact the device's channel region. This significantly reduces any impact regarding Short Channel Effects (SCE) of transistors. The non-conformal layer in the recessed trenches also prevents dopant species scattered into transistor body region underneath gate, so the body region is not narrowed down, which could significantly improve body resistance for I/O devices and other devices.

It is to be understood that the present invention will be described in terms of a given illustrative architecture having a wafer or substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip that may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is illustratively shown. The device 10 includes a plurality of gate stacks 22 formed on a semiconductor on insulator (SOI) substrate 12. The SOI substrate 12 includes a handle substrate 14, a buried dielectric layer 16 and a device semiconductor layer 18. The handle substrate 14 may include any suitable material and, in particularly useful embodiments, may include a semiconductor material, e.g., Si, SiC, SiGe, Ge, GaAs, etc. The buried dielectric layer 16 may include an oxide or nitride, and in a particularly useful embodiment includes $SiO_2$ (e.g., buried oxide or BOX). The device semiconductor layer 18 may include, e.g., Si, SiC, SiGe, Ge, GaAs, etc., and, in particularly useful embodiments, includes monocrystalline Si.

The gate stacks 22 include a gate dielectric 24 and a gate conductor 26. The gate dielectric 24 may include a thermally grown dielectric (e.g., $SiO_2$), a high dielectric constant (hi-K) material (e.g., $HfO_2$) or any other suitable material or layers of materials. The gate conductor 26 may include any suitable conductive material, e.g., Cu, Al, TiN, TaN, W, etc. Before forming the gate stacks 22, regions 20 may be formed. The regions 20 may include a dielectric material (e.g., $SiO_2$) to form isolation regions or conductive material (to form conductive lines, etc.) to connect to other structures. The material for regions 20 is deposited in trenches formed in the semiconductor layer 18. The surface of the semiconductor layer 18 is then planarized to form the regions 20.

Figure 2:
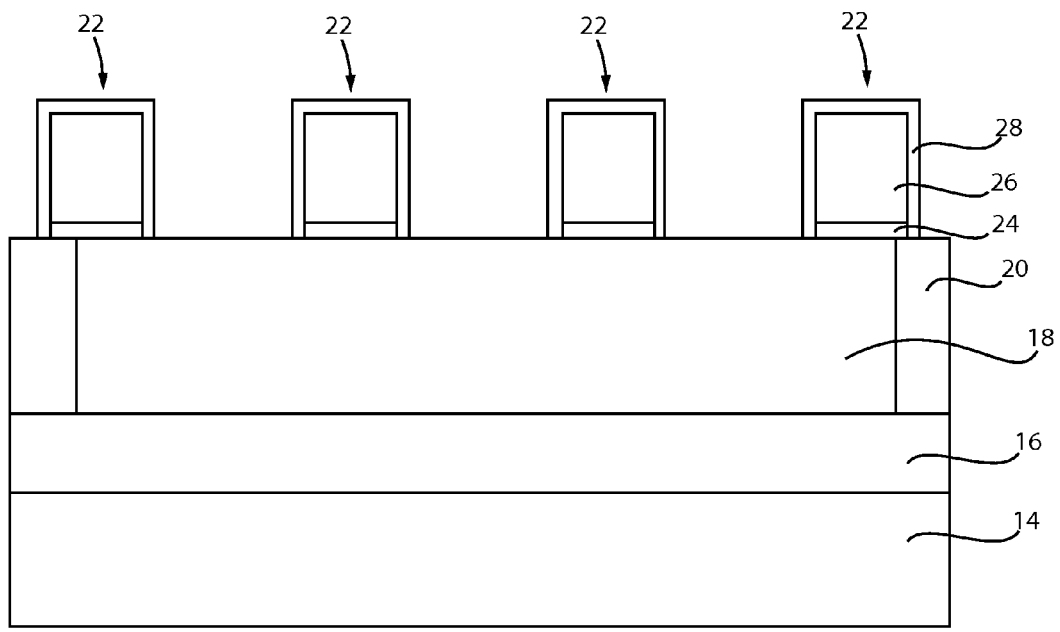
FIG. 2 is a cross-sectional view of the device of FIG. 1 having a spacer layer formed over tops and sidewalls of the gate stacks in accordance with the present principles.

Referring to FIG. 2, a deposition process is carried out to coat the tops and sidewalls of the gates stacks 22 with a dielectric layer followed by a patterned etch to form spacer layers 28. The spacer layers 28 may include a nitride, such as silicon nitride, although other dielectric materials may be employed. The spacer layer 28 encapsulates the gate stack 22 to protect the gate stack 22 during a subsequent halo and/or extension implant and further processing as will be described herein after.

A halo implantation process is employed to form a halo implant below the gate stacks 22 and below a channel region (formed directly below the gate dielectric 24). The halo implant is performed at an angle to pass between the gate stacks 22 and to penetrate the semiconductor layer 18 below the gate stacks 22. An anneal process may be employed.

An extension implantation process is also employed to form extension regions below the gate stacks 22 and on the ends of the channel region (formed directly below the gate dielectric 24). The extension region implants may be performed by a diffusion process or by performing an implantation process at an angle followed by an anneal. The dopants pass between the gate stacks 22 and penetrate the semiconductor layer 18 below the gate stacks 22. Halo and extension regions may be formed using known dopants and processes. Halo and extension regions are not shown in the FIGS. for simplicity and clarity.

Figure 3:
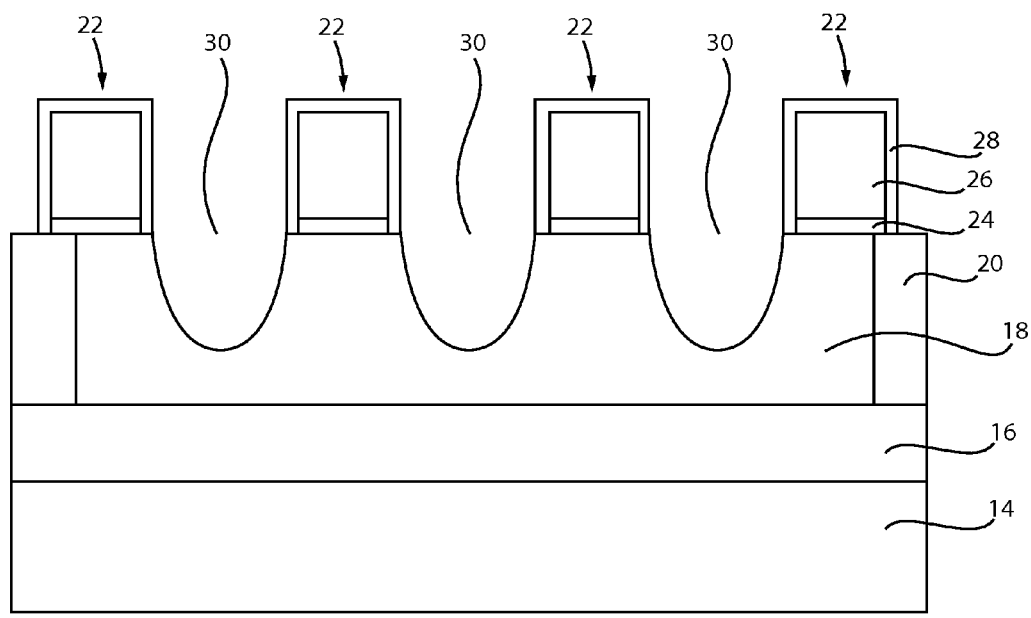
FIG. 3 is a cross-sectional view of the device of FIG. 2 showing recesses formed between the gate stacks in accordance with the present principles.

Referring to FIG. 3, an etching process is performed to form trenches 30 between gates stacks 22. The gate stacks 22, and in particular the spacer layer 28, acts as an etch mask. The etch process may include a reactive ion etch, although wet etching and other etching processes may be employed. The etching process is stopped before breaking through semiconductor layer 18.

Figure 4:
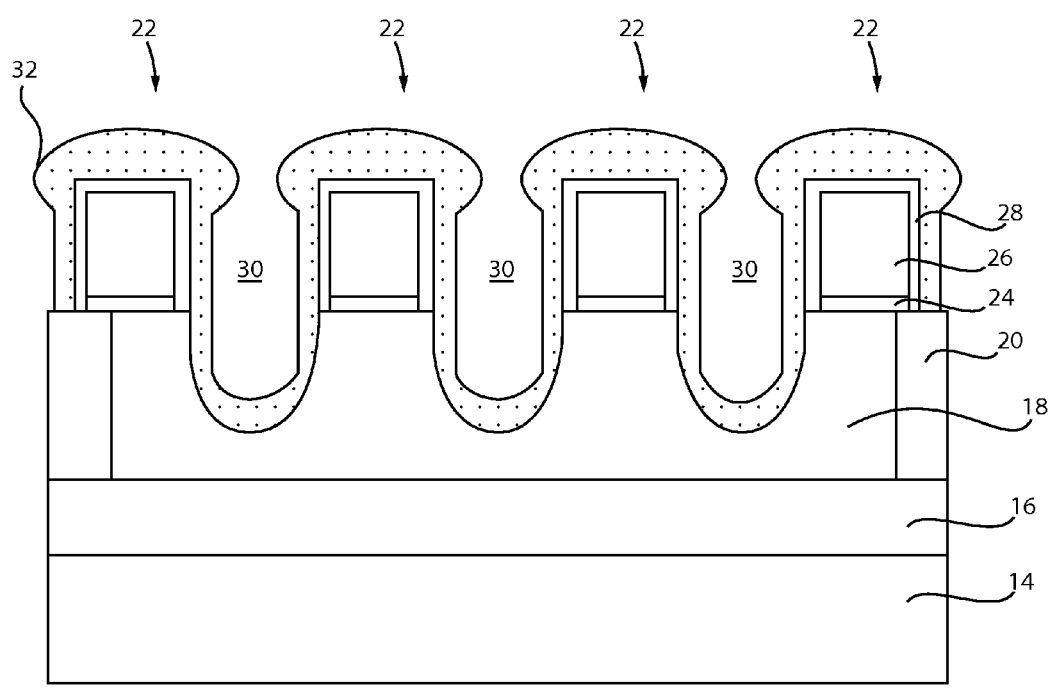
FIG. 4 is a cross-sectional view of the device of FIG. 3 showing a non-conformal layer forming pinch points between the gate stacks in accordance with the present principles.

Referring to FIG. 4, a deposition process is employed to form a non-conformal layer 32 over the spacer layer 28 of gate stacks 22 and in the trenches 30 formed in the semiconductor layer 18. The non-conformal layer 32 may be any material that is selectively removable relative to the spacer layer 28 and the semiconductor layer 18. The non-conformal nature of the layer 32 may be controlled by controlling the processing parameters and materials selected for the deposition process. In one embodiment, the non-conformal layer 32 includes polysilicon, a silicon oxide, etc. formed using a chemical vapor deposition (CVD) process, although other materials and processes may be employed. The non-conformal layer 32 accumulates at the top portions of the gate stacks 22 to the point, depending on a pitch between structures, where the non-conformal layer 32 form a space, gap or opening (25, FIG. 5) of about 10 to 80 nm, preferably 30-40 nm to the trenches 30. The non-conformal layer 32 on adjacent gate stacks needs to be controlled in process so as to not completely pinch-off the trench areas (30), i.e., to leave enough space to perform a reactive ion etch (RIE) to expose the semiconductor layer 18 at a trench bottom, so that junction butting implantation can be provided.

Figure 5:
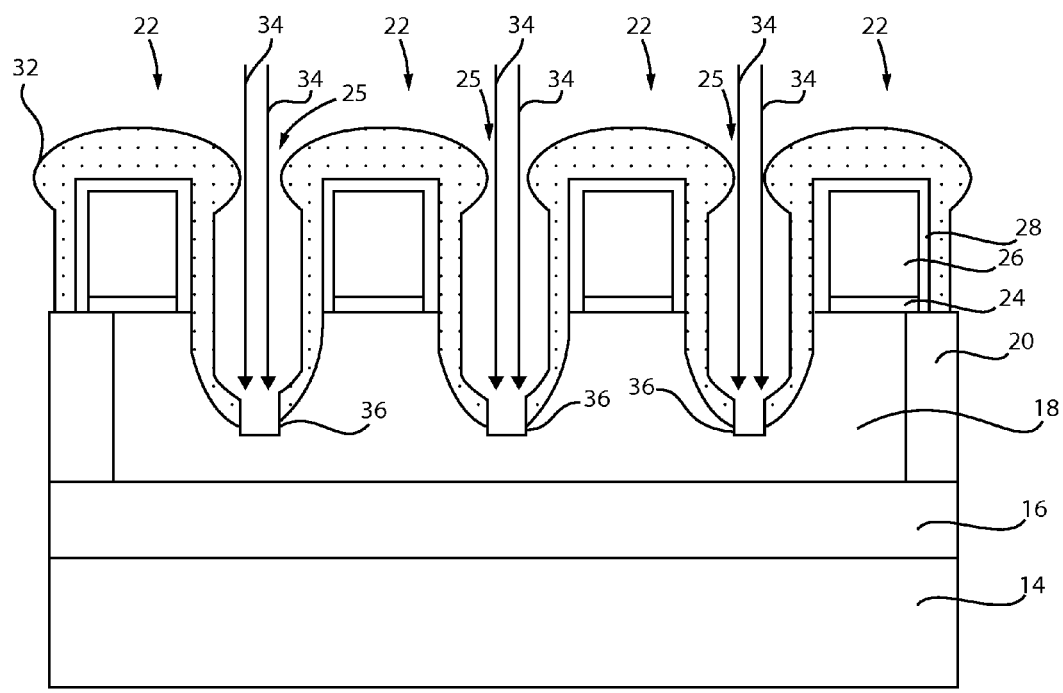
FIG. 5 is a cross-sectional view of the device of FIG. 4 showing a self-aligned etch to form windows through the non-conformal layer and into a semiconductor layer in accordance with the present principles.

Referring to FIG. 5, an anisotropic etch, such as, a reactive ion etch (RIE) is performed to etch through the non-conformal layer 32 to open up windows 36 into the semiconductor layer 18. Reactive ions 34 are directed through gaps 25 by the formation of the non-conformal layer 32. In this way, the windows 36 are self-aligned in the trenches 30 and between the gate stacks 22. The RIE does not break through the semiconductor layer 18.

Figure 6:
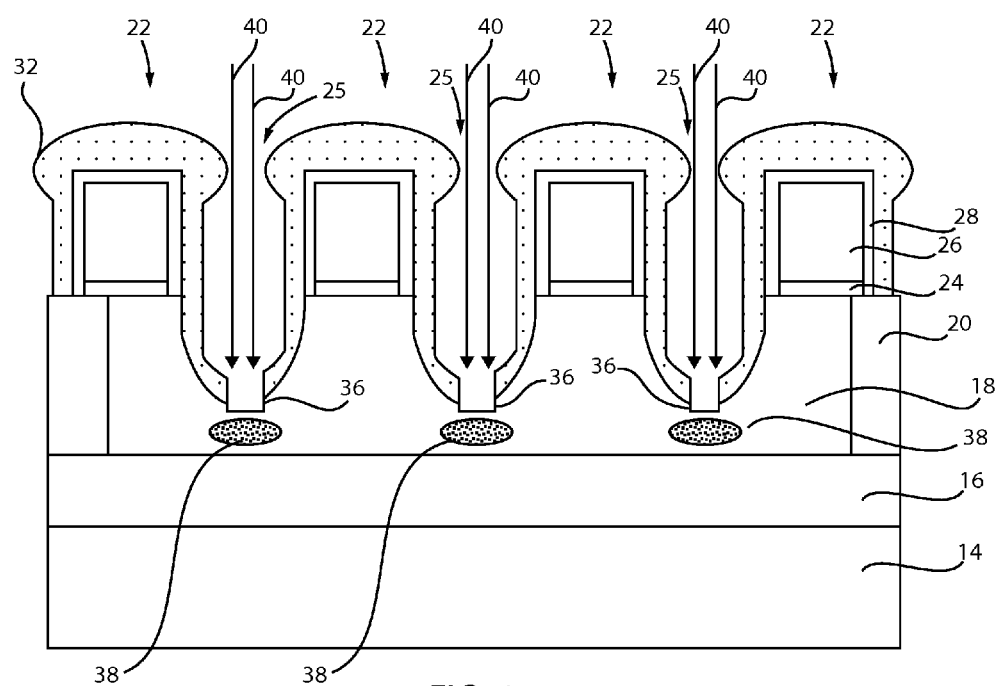
FIG. 6 is a cross-sectional view of the device of FIG. 5 showing a self-aligned implantation process to form implanted regions in a bottom semiconductor layer through the exposed windows in accordance with the present principles.

Referring to FIG. 6, an implantation process is performed to form implanted regions 38 (for junction butts) between adjacent portions of the semiconductor layer 18. The implantation process employs a dopant species which when combined with the material of the semiconductor layer 18 alters its conductive properties, so that a PN junction formed between a transistor body (below the channel region) and a source or drain region is completely butted to the dielectric layer 16 (e.g., BOX). In one embodiment, if the semiconductor layer 18 includes Si, the dopant species may include phosphorus or arsenic for n type transistors; or boron or $BF_2$ for p type transistors. The implanted regions 38 provide a high concentration of implant material. At this time a surface of the semiconductor layer 18 in the window 36 includes a very low concentration of implant species. In this way, the surface of the semiconductor layer 18 in the window 36 is still crystalline and capable of permitting epitaxial growth of source and drain regions as will be described below.

The implanted regions 38 are formed through windows 36 into the semiconductor layer 18. Implanted species 40 are again directed through gaps 25 by the formation of the non-conformal layer 32. In this way, the implanted regions 38 are self-aligned in the trenches 30 and between the gate stacks 22. The implanted regions 38 reduce or prevent charge flow between adjacent portions of the semiconductor layer 18.

Figure 7:
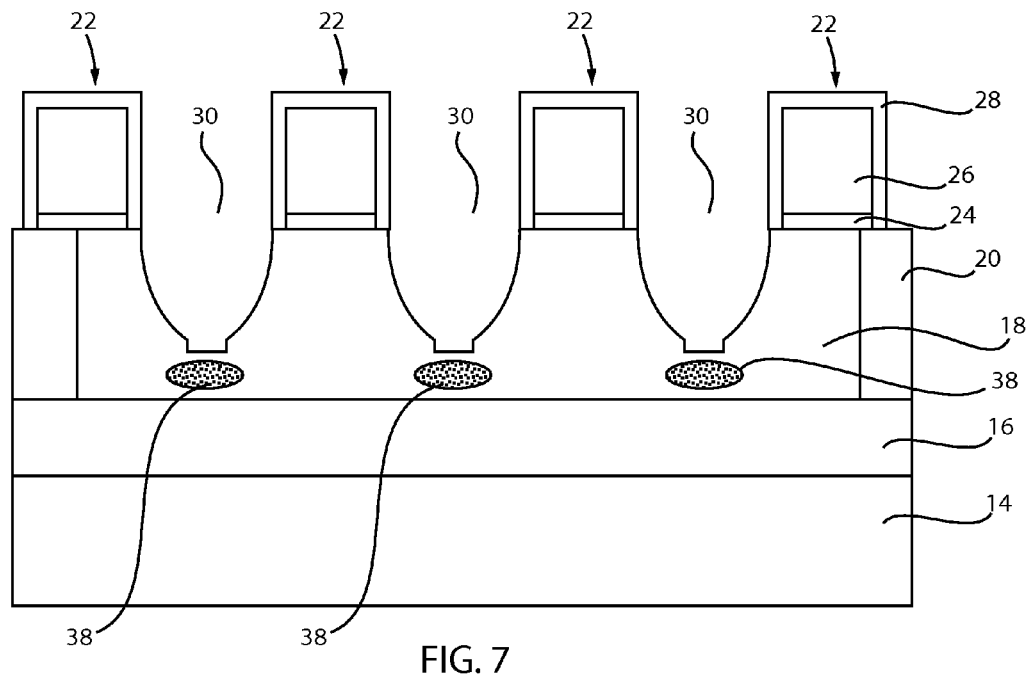
FIG. 7 is a cross-sectional view of the device of FIG. 6 showing the non-conformal layer removed in accordance with the present principles.

Referring to FIG. 7, remaining portions of the non-conformal layer 32 are stripped. This preferably includes performing a selective etch process to selectively remove the non-conformal layer 32 from the spacer layer 28 over the gate stacks 22 and from the semiconductor layer 18 in the trenches 30. The implanted regions 38 are formed below a surface of the semiconductor layer 18. Therefore, the non-conformal layer 32 is selectively removable relative to the material of the semiconductor layer 18 and the spacer layer 28.

Figure 8:
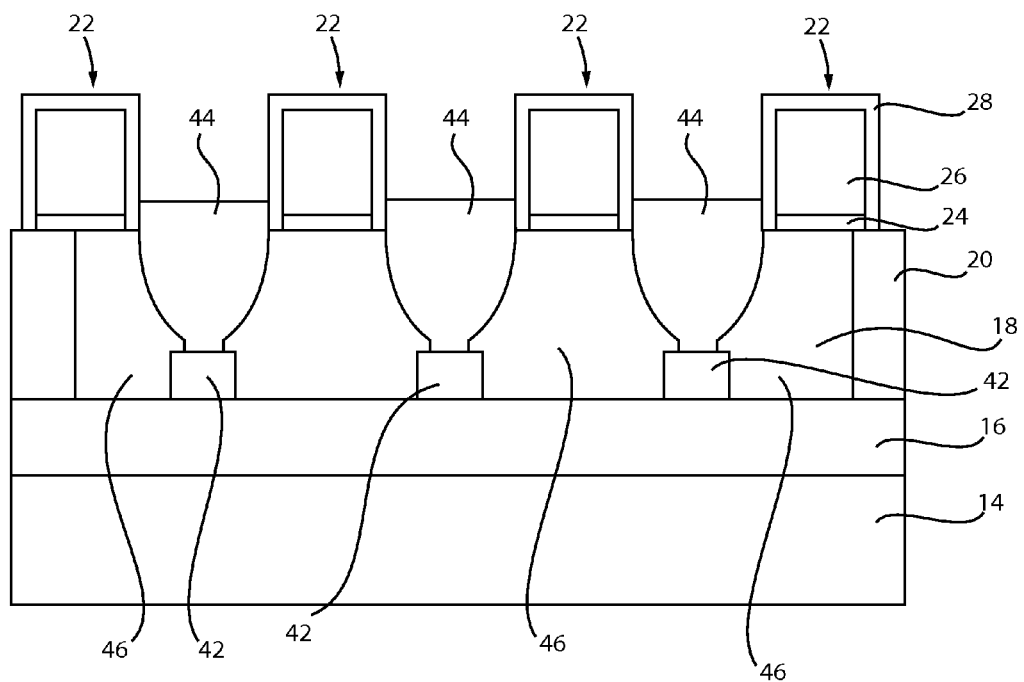
FIG. 8 is a cross-sectional view of the device of FIG. 7 showing the recesses and windows filled with an epitaxially grown material to form source and drain regions and junction butts formed between portions of the semiconductor layer in accordance with the present principles.

Referring to FIG. 8, using the exposed surface of the semiconductor layer 18 in the windows 36, source and drain (S/D) regions 44 are formed. The S/D regions 44 are preferably epitaxially grown using the exposed surface of the semiconductor layer 18 as a seed layer. The epitaxially growth may include growing an in-situ doped Si, SiGe or other useful material. For complementary metal oxide semiconductor applications, the S/D regions 44 may be formed at separate times by employing masking of areas not being processed to, e.g., form n-type device and then p-type devices (or vice versa).

For n-type field effect transistors (nFETs) epitaxial growth in source/drain recess trench may include SiC with in-situ doping with phosphorus or arsenic; for p-type field effect transistors (pFETs) expitaxial growth in source/drain trench could be SiGe with in-situ doping with boron or $BF_2$. A PN junction is formed with the transistor body region.

Depending on the epitaxially growth process selected, the temperature conditions may be controlled to provide activation of the implanted regions 38 to form semiconductor regions 42 with altered conductive properties. Alternately, an anneal process may be employed such as a rapid thermal anneal (RTA) or a laser spike anneal (LSA) above 1000 degrees C. to activate the implanted regions 38. The implanted species in the regions 38 begin to activate in the semiconductor layer 18 to form semiconductor regions 42 with altered conductive properties. Due to processing or annealing temperatures, the implanted species diffuse into the semiconductor layer 18, for example, phosphorus or arsenic implanted to form n-type semiconductor regions; boron or $BF_2$ implanted to form p-type semiconductor regions so that PN junctions are formed between transistor bodies 46 and the source/drain regions 44. The PN junctions 42 are completely butted to the buried dielectric layer 16.

The dopant atoms are activated in the semiconductor layer 18, which has a same conductivity as source/drain regions 44, but an opposite conductivity from the body region 46 underneath the transistor gate structures 22. In this way, PN junctions of source to body and drain to body are butted to a buried dielectric layer 16 (buried oxide (BOX)) completely, so that the butted junctions shut off cross-talk (current leakage) between bodies of adjacent transistors which share common contacts. This junction butting scheme could be also extended to between portions of the semiconductor layer.

The junction butts 42 block the flow of charge between adjacent portions 46 of the semiconductor layer 18, to prevent cross talking between adjacent devices. This junction butting scheme with sidewall spacers in trenches also prevents dopant species from scattering into the transistor bodies (46) during junction butting implantation. This results in significant improvements in body resistance over conventional junction butting implants which cannot avoid transistor body narrowing due to such scattering are impurities, especially for input/out (I/O) integrated circuit devices, analog devices or chips, employed in, e.g., gain blocks, modems, network interfaces, etc.

Figure 9:
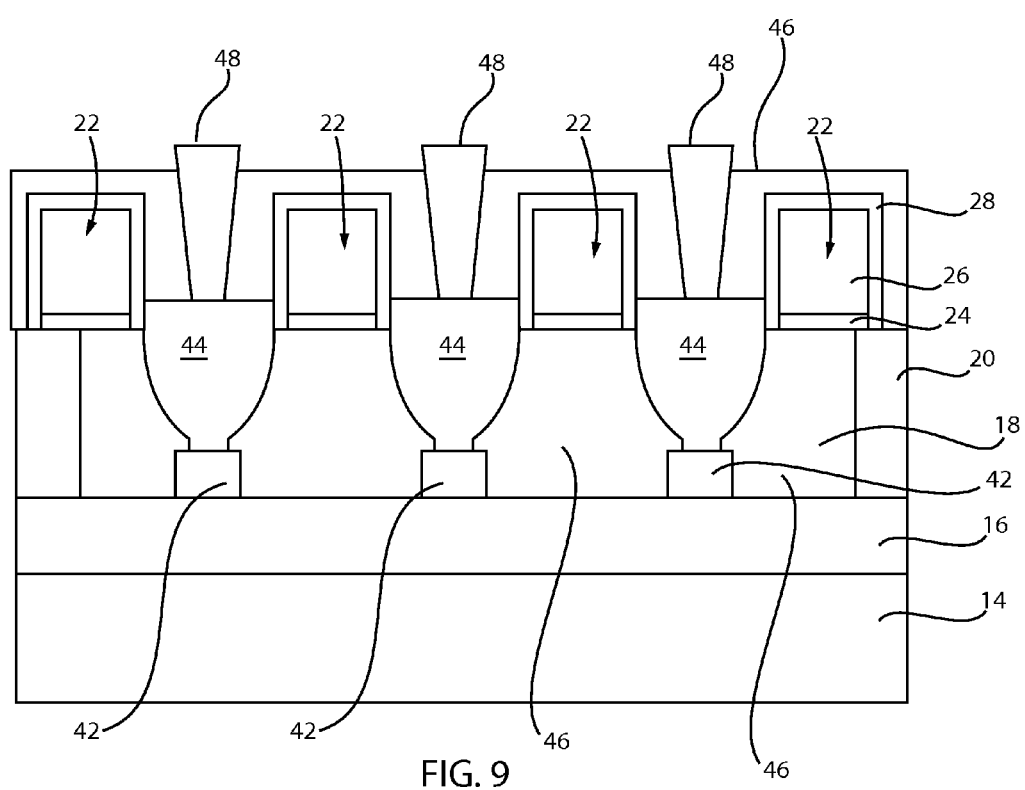
FIG. 9 is a cross-sectional view of the device of FIG. 8 showing interlevel dielectric material formed over the gate stacks and contacts formed to the source and drain regions in accordance with the present principles.

Referring to FIG. 9, processing continues with middle of the line (MOL) and back end of the line (BEOL) processing. A dielectric layer 46 is deposited, planarized and patterned to open up vias for the formation of contacts 48. The dielectric layer 46 may include a silicon oxide although other suitable dielectric materials may be employed. The patterning process preferably includes lithography, and the planarization process preferably includes chemical mechanical polishing (CMP). Once the via holes are formed, a barrier layer (not shown) may be deposited followed by a metal deposition and planarization step (e.g., CMP) to form the contacts 48. The metal may include W, Al, Cu, etc.

In accordance with the present principles, self-aligned mask-less implantation methods are provided that form junction butting structures between electronic devices. The methods eliminate the need for employing a lithography process to pattern a mask for junction butting implantation. Instead, mask-less methods are employed to eliminate resist residual risk in source/drain trenches or other structures. The implantation is completely self-aligned without the need to form resist block masks or resist etch masks. In addition, in one structure, junction butting implant species are aligned at a bottom of the trenches. In this way, implant species are kept away from channel regions and therefore have little or no impact the device's channel region. This significantly reduces any impact regarding Short Channel Effects (SCE). Implant species are kept away from device's body regions as well and therefore have little or no impact the device's body region. This provides significant improvement for body resistance in transistor devices.

It should be understood that the present principles are particularly useful in devices that share contacts and S/D regions; however, the present embodiments may be extended to any semiconductor device. The present principles may be employed with CMOS devices, MOSFETs, finFETs, etc.

Figure 10:
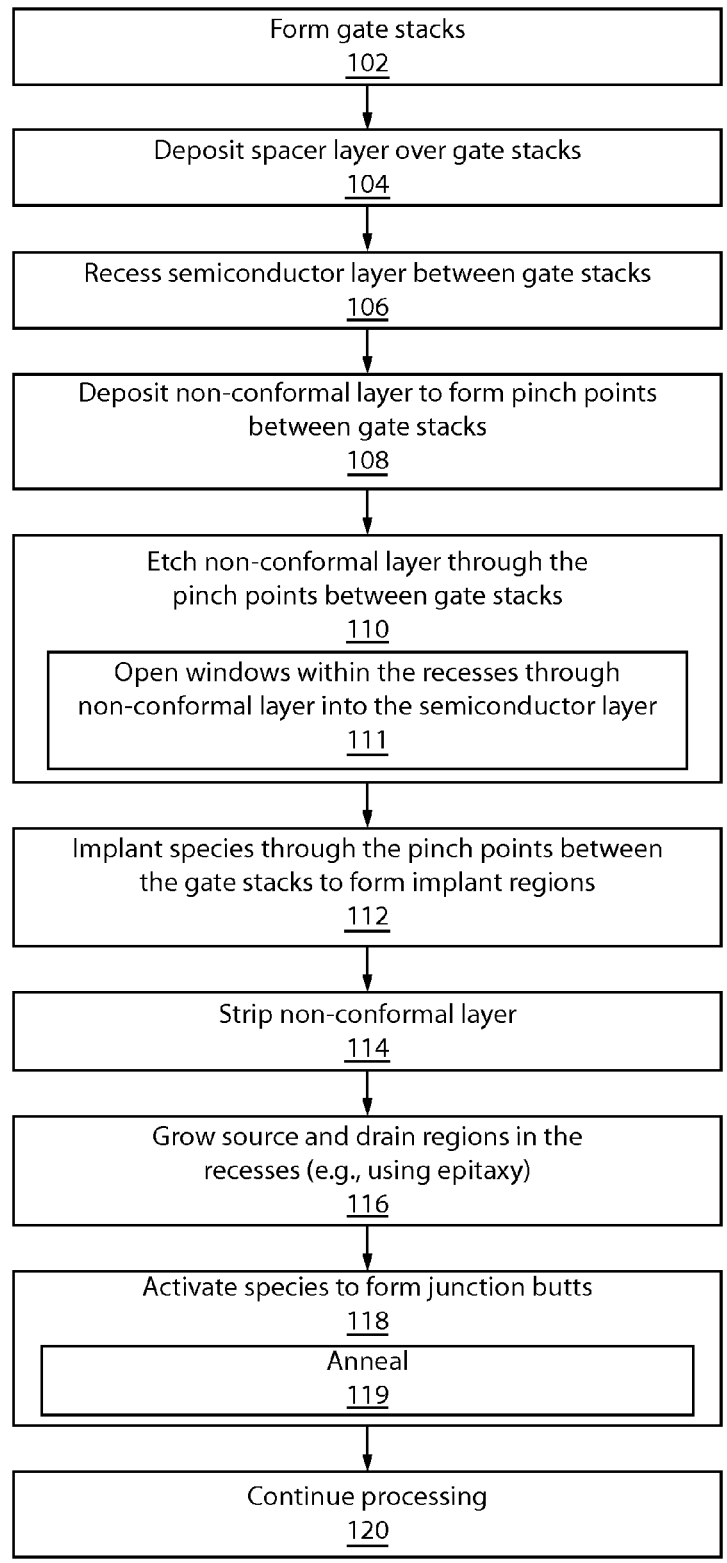
FIG. 10 is a block/flow diagram showing methods for forming a semiconductor device in accordance with illustrative embodiments.

Referring to FIG. 10, method for fabricating a semiconductor device with junction butts is shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, gate stacks are formed on a crystalline semiconductor layer. In block 104, a spacer layer is deposited over a top and sidewalls of the gate stacks. In block 106, the semiconductor layer is recessed between the gates stacks. In block 108, a non-conformal layer is deposited over the gates stacks and within the recesses such that the non-conformal layer forms a pinch point over the recesses. In one embodiment, the non-conformal layer includes an oxide layer formed by using a chemical vapor deposition process.

In block 110, the non-conformal layer is etched at a bottom of the recesses through the pinch point to expose the semiconductor layer. In block 111, the etching may include opening a window in the semiconductor layer. The window portion may be employed in growing source and drain material in the recesses (e.g., epitaxial growth). The etching is preferably self-aligned to form the windows through the non-conformal layer to expose the semiconductor layer. The windows are preferably substantially centered in the recess.

In block 112, dopant atoms are implanted at the bottom of the recesses through the pinch point in the semiconductor layer. The implanted species preferably include phosphorus or arsenic for n-type transistors to form an n-type semiconductor region at the recess bottom, and include a same conductivity type as adjacent source/drain regions. In a similar way for p-type transistors, boron or $BF_2$ may be implanted to form p-type semiconductor regions at the recess bottom. A PN junction formed between transistor bodies and source/drain regions is completely butted to the buried dielectric layer (BOX), so that a charge current leakage path underneath junction is completely shut off. The implantation process forms self-aligned implant regions, which are preferably substantially centered in the recess.

In block 114, the non-conformal layer is stripped. In block 116, source and drain material is grown in the recesses. In block 118, the implanted species are activated to alter conductive properties. The implanted species have a same conductivity as source/drain regions, so the PN junctions formed between the transistor body and the source or the transistor body and drain are completely butted to the buried dielectric underneath. In block 119, activation may include annealing such that the implanted species. The processing temperatures for forming the S/D regions or other processes may also be employed to activate the implants. In block 120, processing continues with the formation of MOL and BEOL structures (e.g., metal lines and contacts), etc.

In one embodiment, the crystalline substrate includes a handle substrate for a semiconductor on insulator (SOI) structure, and the semiconductor layer includes a semiconductor device layer of the SOI structure and a buried dielectric is disposed between the handle substrate and the semiconductor device layer. The junction butts are formed in the semiconductor device layer disposed between the source and drain regions at a bottom of the recess and the buried dielectric layer.

Having described preferred embodiments for self-aligned maskless junction butting for integrated circuits (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming gate stacks on a crystalline semiconductor layer;
   depositing a spacer layer over a top and sidewalls of the gate stacks;
   recessing the semiconductor layer between the gates stacks;
   depositing a non-conformal layer over the gates stacks and within the recesses such that the non-conformal layer forms a pinch point over the recesses;
   etching the non-conformal layer at a bottom of the recesses through the pinch point to expose the semiconductor layer;
   implanting dopant species at the bottom of the recesses through the pinch point in the semiconductor layer;
   stripping the non-conformal layer;
   growing source and drain material in the recesses; and
   activating the dopant species to form PN junctions to act as a junction butt between portions of the semiconductor layer.

2. The method as recited in claim 1, wherein depositing a non-conformal layer includes depositing an oxide layer using a chemical vapor deposition process.

3. The method as recited in claim 1, wherein implanting dopant species includes a dopant species having a same conductivity type as source and drain regions formed from the source and drain material.

4. The method as recited in claim 3, wherein activating the dopant species includes annealing such that the dopant species alter conductive properties of the semiconductor layer.

5. The method as recited in claim 1, wherein etching the non-conformal layer at a bottom of the recesses through the pinch point to expose the semiconductor layer includes opening a window in the semiconductor layer and the step of growing source and drain material in the recesses includes epitaxially growing the source and drain material from the window.

6. The method as recited in claim 1, wherein the crystalline substrate includes a handle substrate for a semiconductor on insulator (SOI) structure, and the semiconductor layer includes a semiconductor device layer of the SOI structure and a buried dielectric is disposed between the handle substrate and the semiconductor device layer such that the junction butts are formed in the semiconductor device layer disposed between the source and drain regions at a bottom of the recess and the buried dielectric layer.

7. The method as recited in claim 1, wherein etching the non-conformal layer at the bottom of the recesses includes forming self-aligned windows through the non-conformal layer that expose the semiconductor layer.

8. The method as recited in claim 7, wherein implanting dopant species at the bottom of the recesses includes forming self-aligned implant regions.

9. A method for forming a semiconductor device, comprising:
   forming gate stacks on a crystalline semiconductor layer of a semiconductor on insulator (SOI) structure;
   depositing a spacer layer over a top and sidewalls of the gate stacks;
   recessing the semiconductor layer between the gates stacks without reaching a buried dielectric of the SOI structure;
   depositing a non-conformal layer over the gates stacks and within the recesses such that the non-conformal layer forms a pinch point over the recesses;
   etching the non-conformal layer at a bottom of the recesses through the pinch point to form self-aligned windows that expose the semiconductor layer;
   implanting dopant species at the bottom of the recesses through the pinch point and into the windows in the semiconductor layer to form self-aligned implant regions;
   stripping the non-conformal layer;
   growing source and drain material in the recesses; and
   activating the implant regions to form PN junctions to act as a junction butt between portions of the semiconductor layer.

10. The method as recited in claim 9, wherein depositing a non-conformal layer includes depositing an oxide layer using a chemical vapor deposition process.

11. The method as recited in claim 9, wherein implanting dopant species includes a dopant species having a same conductivity type as source and drain regions formed from the source and drain material.

12. The method as recited in claim 11, wherein activating dopant species includes annealing such that the dopant species alter conductive properties of the semiconductor layer.

13. The method as recited in claim 9, wherein growing source and drain material in the recesses includes epitaxially growing the source and drain material from the windows.

14. The method as recited in claim 9, further comprising forming halo and extension regions in the semiconductor layer.

* * * * *